US006504350B2

(12) United States Patent
Leonowich

(10) Patent No.: US 6,504,350 B2
(45) Date of Patent: Jan. 7, 2003

(54) ADAPTIVE POWER SUPPLY ARRANGEMENT

(75) Inventor: Robert H. Leonowich, Muhlenberg Township, Berks County, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/847,807

(22) Filed: May 2, 2001

(65) Prior Publication Data

US 2002/0171404 A1 Nov. 21, 2002

(51) Int. Cl.[7] .............................. G05F 1/40; G11C 7/00
(52) U.S. Cl. ....................................... 323/281; 365/226
(58) Field of Search ................................ 323/281, 282, 323/285, 273, 280, 284; 365/189, 226

(56) References Cited

U.S. PATENT DOCUMENTS 3,946,328 A * 3/1976 Boctor ....................... 330/107
4,298,835 A * 11/1981 Rowe ......................... 323/281
4,893,228 A 1/1990 Orrick et al.
5,440,520 A 8/1995 Schutz et al.
5,563,501 A * 10/1996 Chan .......................... 323/282
5,583,454 A 12/1996 Hawkins et al.
5,768,147 A 6/1998 Young
5,852,737 A 12/1998 Bikowsky
5,889,393 A * 3/1999 Wrathall ..................... 323/282
5,959,926 A 9/1999 Jones et al.
6,031,364 A * 2/2000 Hosono et al. ............. 323/280

OTHER PUBLICATIONS

LM723/LM723C Voltage Regulator, National Semiconductor Data Sheets, Jun. 1999.

* cited by examiner

*Primary Examiner*—Rajnikant B. Patel
(74) *Attorney, Agent, or Firm*—Wendy W. Koba

(57) ABSTRACT

An arrangement for adjusting a fixed power supply voltage level to a different level that may be required by a connected circuit module comprises a differential amplifier and resistor divider network. A reference voltage is applied to the positive input of the differential amplifier and an internal node voltage within the resistor divider network is fed back as the negative input. The values of the resistors in the network are specifically chosen to provide for the desired voltage level. Each such arrangement of the present invention may then be individually tailored for the particular circumstance.

16 Claims, 2 Drawing Sheets

ADAPTIVE POWER SUPPLY ARRANGEMENT

TECHNICAL FIELD

Figure 1:
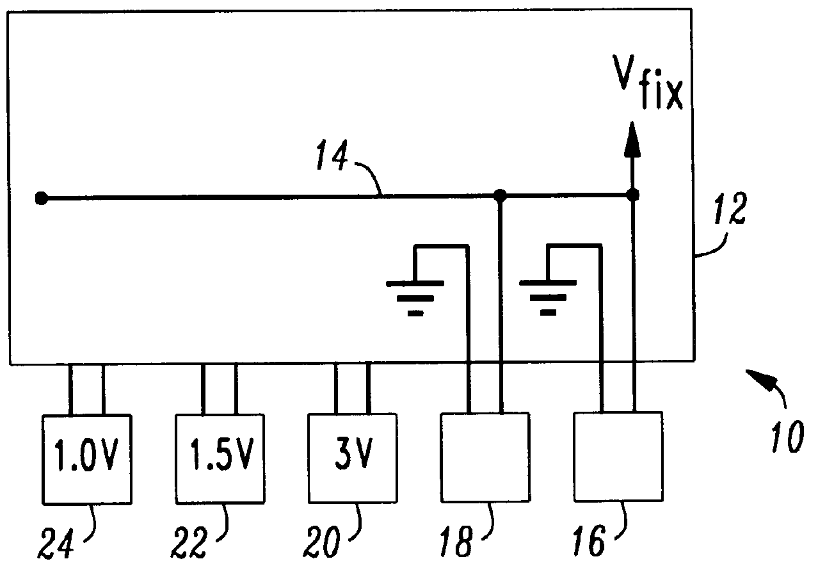

The present invention is related to an adaptive power supply module and, more particularly, to a module that is configured to adapt a fixed input power supply voltage to a predetermined level required to power a particular circuit or other arrangement.

BACKGROUND OF THE INVENTION

Integrated circuit technology is constantly being advanced by a reduction in the size of the transistors used for circuit implementation, as well as the overall size of the circuit itself. One natural result of the reduction in transistor size is the concomitant reduction in the voltage level required to power the circuit. Not that many years ago, most integrated circuits would require a +/−5V power supply. Many circuits today operate at +/−3V, and newer circuits require as little as +/−1.8V. Power supply voltages dropping below the 1V level is not out of the realm of possibilities.

When designing a complete circuit architecture at one time, the choice of power supply voltage can be handled and regulated through the circuit. That is, a fixed power supply (for example) can be utilized with any number or type of voltage regulator (e.g., a bandgap reference) to generate various desired supply voltage levels. However, there are many instances where a power-providing circuit, developed at one point in time, will need to be connected to a number of other circuits, developed over a period of years. In this case, the various power supply requirements of each separate module will become problematic. For example, a communications motherboard may have a plurality of N output ports available to accept a plurality of N separate transmit/receive modules. The transmit/receive modules may often times be re-developed over the course of time and, as a result, a later-developed module of the same "type" may operate at a lower voltage than a predecessor design.

Thus, it would be desirable to provide an arrangement permitting modules of the same type, but operating at different reference voltages, to all be connected to and used with the same master circuit board.

SUMMARY OF THE INVENTION

The need remaining in the prior art is addressed by the present invention, which relates to an adaptive power supply module and, more particularly, to a module that is configured to adapt a fixed supply voltage to a, second, predetermined (different) level required to power a particular circuit or other arrangement. The module is utilized as an interface between the first, fixed supply voltage and the second, predetermined voltage input to the adjoining circuit. Each module may be individually configured to provide for the necessary correction between the fixed supply and the other circuit-required power supply.

In a preferred embodiment of the present invention, a fixed supply voltage source is used generate a predetermined reference voltage using, for example, a bandgap reference voltage generator. A resistor divider network and differential amplifier are used to form the adaptive power supply module and, in this case, reduce the generated reference voltage level to a predetermined lower (for example) level needed by the individual circuit. The fixed supply voltage is used to power the differential amplifier and the generated reference voltage is applied as a first input to the differential amplifier, where the resistor divider network is coupled to the amplifier output. The choice of the resistor values in the resistor divider network is used to control the actual output voltage, $V_{prog}$, and an internal node voltage in the resistor divider network is fed back to the difference input of the differential amplifier.

In one embodiment of the present invention, the resistor values may be adjusted during the lifetime of the circuit implementation to adjust for power supply changes as a function of time.

Other and further embodiments of the present invention will become apparent during the course of the following discussion and by reference to the accompanying drawings.

BRIEF DESCRIPTION OF TTHE DRAWINGS

Figure 2:
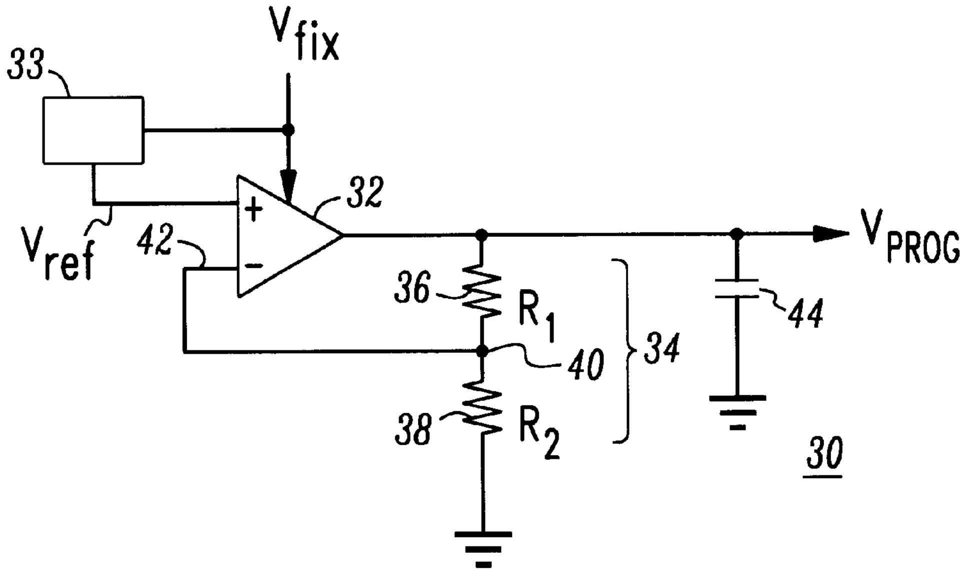
Figure 3:
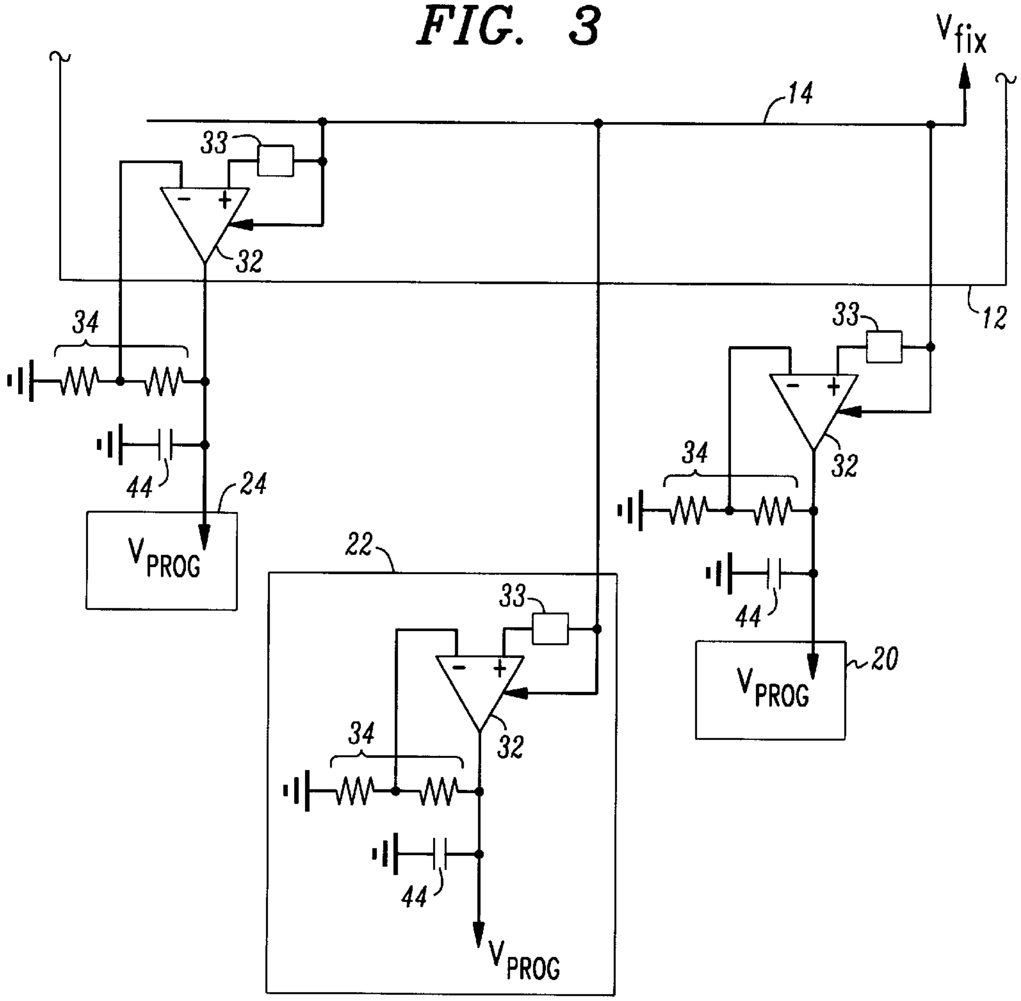
Figure 4:
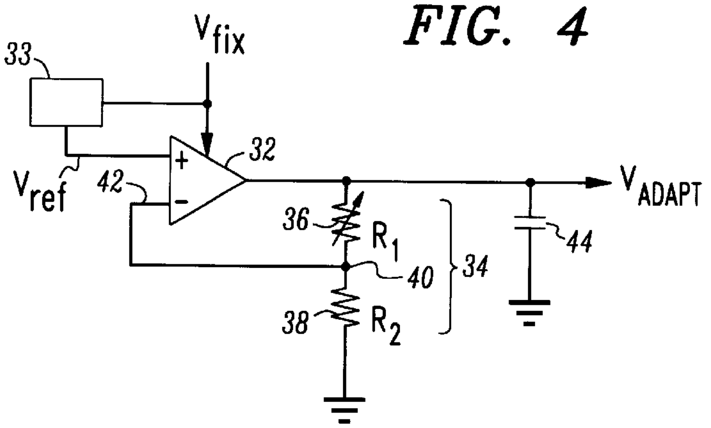

Referring now to the drawings,

FIG. 1 illustrates, in simplified block diagram form, an exemplary backplane/module arrangement in which the module of the present invention may be useful;

FIG. 2 contains a diagram of an exemplary adaptive power supply module formed in accordance with the present invention;

FIG. 3 is a diagram embodying three alternative implementations of the module of the present invention; and FIG. 4 illustrates an alternative embodiment of the present invention, including an adjustable resistor in the resistor divider network.

DETAILED DESCRIPTION

An exemplary circuit arrangement 10 that may implement the adaptive power supply module of the present invention is illustrated in FIG. 1, where this diagram is most useful in understanding the problem addressed by the adaptive power arrangement of the invention. In this example, a main circuit arrangement 12 is utilized to connect with a number of individual circuit elements, through a power connection 14 to a fixed power supply (denoted $V_{fixed}$). As originally designed, circuit arrangement 12 is configured to provide a +5V power supply voltage to the individual circuit elements. A first pair of circuit elements 16 and 18 are configured to require a +5V power supply and are directly connected to the power connection outputs of main circuit arrangement 12. An additional circuit element 20 is either obtained at a later time, from another supplier, or under circumstances such that element 20 requires only a 3V power supply. Circuit elements 22 and 24, as shown in FIG. 1, have even lesser power supply requirements, denoted (as an example) as 1.5V and 1V, respectively. However, it is desired to still power each of the elements off of power connection 14. Obviously, a direct connection between circuit elements 20, 22, 24 and power connection 14 will harm the discrete components within these circuit elements.

FIG. 2 contains a schematic diagram of an adjustable power supply module 30 that may be used with each of the circuit elements of FIG. 1 and inserted as an interface between power connection 14 of arrangement 12 and the input power supply line of each individual circuit element. As shown, module 30 comprises a differential amplifier 32, where power connection 14, denoted as $V_{fixed}$ (and is +5V in the arrangement of FIG. 1), is applied as the power supply input to amplifier 32. A reference voltage generator 33 (for example, a bandgap reference circuit) is coupled between power supply $V_{fixed}$ and the positive input to differential amplifier 32, where reference voltage generator 33 is used to supply an arbitrary, known reference voltage $V_{ref}$. A simple resistor divider network 34 is coupled between the output of amplifier 32 and ground potential, where in this example resistor divider network 34 comprises a first resistor 36 ($R_1$) and a second resistor 38 ($R_2$), the connection 40 between first resistor 36 and second resistor 38 is then fed back as the differential input 42 to differential amplifier 32. The output from differential amplifier 32, denoted $V_{prog}$, is then used as the input supply voltage to an individual circuit module, where the following equation describes the relationship between $V_{ref}$ and $V_{prog}$:

$$V_{prog} = \left(\frac{R_1 + R_2}{R_2}\right) * V_{ref}$$

Therefore, by careful choice of the values of $R_1$ and $R_2$, coupled with knowing the value of reference voltage $V_{ref}$, the desired programmable supply voltage $V_{prog}$ can be generated. For example, in order to provide a +1.5V power supply voltage for circuit element 22 in FIG. 1, $R_1$ may be equal to 2 kΩ and $R_2$ may then be equal to 1 kΩ, with $V_{ref}$=0.5V. Other combinations of $R_1$ and $R_2$ are obviously possible. In accordance with the present invention, the scaled output voltage appearing at node 40, dictated by the values of $R_1$ and $R_2$ is then compared to reference voltage $V_{ref}$ within differential amplifier 32, which thus adjusts its output accordingly.

An advantage of the adjustable power supply arrangement of the present invention, in particular the feedback loop, is that the IR drop across connection A is essentially eliminated by proper choice of the values of $R_1$ and $R_2$, with respect to the input impedance of operational amplifier 32. An additional bypass capacitor 44 may be added to adjustable power module 30, as shown in FIG. 2, to reduce fluctuations on the DC power output.

As long as the arrangement of invention is disposed between the output power supply rail of the first circuit and the input power supply rail of the second circuit, its actual location is of no consequence. FIG. 3 illustrates an arrangement including three different implementations of the invention. In association with circuit element 20, adjustable module 30 is illustrated as included within an interface connection between first circuit arrangement 12 and circuit element 20. Alternatively, module 30 may be incorporated fully within the "front end" of the circuit element, as depicted in association with circuit element 22. A third embodiment of the present invention, as shown in association with circuit element 24, disposes differential amplifier 32 after power connection 14 in first circuit 12, then extends the resistor divider network 34 into either a connection interface (as shown) or, alternatively, network 34 may be located within element 24. In any case, as long as the system user is able to dictate the values of $R_1$ and $R_2$ for each individual circuit element, the adjustable power supply module may be disposed at any convenient location.

FIG. 4 illustrates an alternative arrangement of the present invention where first resistor 36 is an adjustable resistance, so that changes in power supply demand, as a function of time, may be accommodated by re-setting its resistance value. Although not particularly illustrated, it is to be understood that second resistor 38 may also be adjustable. Indeed, if adjustable power supply module is located within a connector separate from the actual circuit element, the capability to adjust one (or both) of the resistance values allows for circuits of different power supply requirements to use the same adjustable module.

The various embodiments of the present invention, as described above, are considered as exemplary only of the present invention. In general, the subject matter of the present invention is intended to be limited only by the scope of the claims appended hereto.

What is claimed is:

1. An adaptive power supply module disposed as an interface between a fixed supply voltage source and an associated integrated circuit to be powered, said adaptive power supply module for converting a fixed supply voltage ($V_{fixed}$) from said fixed supply voltage source to a predetermined input voltage ($V_{prog}$) required to power said associated integrated circuit, said adaptive power supply module comprising an arrangement for generating a defined reference voltage ($V_{ref}$) from said fixed, known voltage;

a differential amplifier including a first, positive input and a second, negative input and an output, the differential amplifier powered by said fixed, known voltage and the defined reference voltage is applied as an input to the first, positive input; and a resistor divider network, including an internal divided voltage node, coupled between the differential amplifier output and ground potential, wherein said internal node in the divider network is tapped and applied as the second, negative input to said differential amplifier, said differential amplifier output defining the predetermined input voltage to the associated integrated circuit.

2. An adaptive power supply module as defined in claim 1 wherein the resistor divider network comprises a first resistance $R_1$ and a second resistance $R_2$ connected in series, with the internal node defined therebetween, so as to define the relationship between $V_{ref}$ and $V_{prog}$ as follows:

$$V_{prog} = \left(\frac{R_1 + R_2}{R_2}\right) * V_{ref}.$$

3. An adaptive power supply module as defined in claim 1 wherein the arrangement further comprises a bypass capacitor disposed in parallel with the resistor divider network.

4. An adaptive power supply module as defined in claim 1 wherein at least one resistance in the resistor divider network comprises an adjustable resistor, wherein the predetermined input voltage to the associated integrated circuit is adjusted as a function of the resistor adjustment.

5. An adaptive power supply module as defined in claim 2 wherein at least one resistance in the resistor divider network comprises an adjustable resistor.

6. An adaptive power supply module as defined in claim 5 wherein the first resistance is adjustable.

7. An adaptive supply module as defined in claim 5 wherein the second resistance is adjustable.

8. An adaptive supply module as defined in claim 1 wherein the predetermined input voltage $V_{prog}$ is less than the defined reference voltage.

9. An arrangement for providing a plurality of different input voltages to a plurality of N different integrated circuits associated with a single fixed supply voltage ($V_{fixed}$), said arrangement comprising a plurality of N adaptive power supply modules with each module for converting said fixed supply voltage to a predetermined input voltage ($V_{prog}$) required to power an associated integrated circuit and each adaptive power supply module comprising an arrangement for generating a defined reference voltage ($V_{ref}$) from said fixed, known voltage;

a differential amplifier including a first, positive input and a second, negative input and an output, the differential amplifier powered by said fixed, known voltage and the defined reference voltage is applied as an input to the first, positive input; and a resistor divider network, including an internal divided voltage node, coupled between the differential amplifier output and ground potential, wherein said internal node in the divider network is tapped and applied as the second, negative input to said differential amplifier, said differential amplifier output defining the predetermined input voltage to the associated integrated circuit.

10. An arrangement as defined in claim 9, wherein the resistor divider network in at least one adaptive power supply module comprises a first resistance $R_1$ and a second resistance $R_2$ connected in series, with the internal node defined therebetween, so as to define the relationship between $V_{ref}$ and $V_{prog}$ as follows:

$$V_{prog} = \left(\frac{R_1 + R_2}{R_2}\right) * V_{ref}.$$

11. An arrangement as defined in claim 9 wherein at least one adaptive power supply module further comprises a bypass capacitor disposed in parallel with the resistor divider network.

12. An arrangement as defined in claim 9 wherein at least one resistance in a resistor divider network in at least one adaptive power supply module comprises an adjustable resistor, wherein the predetermined input voltage to the associated integrated circuit is adjusted as a function of the resistor adjustment.

13. An arrangement as defined in claim 10 wherein, in at least one adaptive power supply module, at least one resistance in the resistor divider network comprises an adjustable resistor.

14. An arrangement as defined in claim 13 wherein the first resistance is adjustable.

15. An arrangement as defined in claim 13 wherein the second resistance is adjustable.

16. An arrangement as defined in claim 9 wherein in at least one adaptive power supply module the predetermined input voltage $V_{prog}$ is less than the defined reference voltage.

* * * * *